(12) United States Patent  (10) Patent No.: US 10,611,063 B2
Murayama  (45) Date of Patent: Apr. 7, 2020

(54) IMPRINT APPARATUS, AND METHOD OF MANUFACTURING ARTICLE

(71) Applicant: CANON KABUSHIKI KAISHA, Tokyo (JP)

(72) Inventor: Genki Murayama, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 827 days.

(21) Appl. No.: 14/779,103

(22) PCT Filed: Nov. 14, 2014

(86) PCT No.: PCT/JP2014/080833
§ 371 (c)(1),
(2) Date: Sep. 22, 2015

(87) PCT Pub. No.: WO2015/087687
PCT Pub. Date: Jun. 18, 2015

(65) Prior Publication Data
US 2016/0052179 A1  Feb. 25, 2016

(30) Foreign Application Priority Data
Dec. 9, 2013  (JP) ................. 2013-254490

(51) Int. Cl.
*B29C 43/58* (2006.01)
*G03F 7/00* (2006.01)
*B29C 59/02* (2006.01)

(52) U.S. Cl.
CPC ............ *B29C 43/58* (2013.01); *B29C 59/022* (2013.01); *G03F 7/0002* (2013.01); *B29C 2043/5833* (2013.01)

(58) Field of Classification Search
None
See application file for complete search history.

(56) References Cited

U.S. PATENT DOCUMENTS

| 5,772,905 A * | 6/1998 | Chou | B29C 59/022 |
| | | | 216/44 |
| 7,785,091 B2 * | 8/2010 | Kasumi | B29C 59/022 |
| | | | 425/149 |
| 7,798,801 B2 * | 9/2010 | Babbs | B82Y 10/00 |
| | | | 355/76 |

(Continued)

FOREIGN PATENT DOCUMENTS

| JP | 2007-081048 A * | 3/2007 |
| JP | 2007081048 A | 3/2007 |

(Continued)

OTHER PUBLICATIONS

Office Action issued in Korean Appln. No. 10-2015-7037060 dated Jul. 6, 2016.

(Continued)

*Primary Examiner* — Matthew J Daniels
*Assistant Examiner* — Mohammad M Ameen
(74) *Attorney, Agent, or Firm* — Rossi, Kimms & McDowell LLP

(57) ABSTRACT

The present invention provides an imprint apparatus for performing an imprint process which includes molding of imprint material on a substrate with a mold and releasing of the mold from the molded imprint material, the apparatus including a substrate holder configured to hold the substrate, a mold holder configured to hold the mold, a driving device configured to perform driving, for the releasing of the mold, of at least one of the substrate holder and the mold holder, and a detector configured to detect completion of the releasing of the mold by the driving device.

21 Claims, 11 Drawing Sheets

(56) References Cited

U.S. PATENT DOCUMENTS

| | | | |
|---|---|---|---|
| 7,914,717 B2 | 3/2011 | Yamada et al. | |
| 8,550,801 B2* | 10/2013 | Furutono | B29C 59/022 |
| | | | 264/293 |
| 2004/0249609 A1* | 12/2004 | Hocheng | B82Y 10/00 |
| | | | 702/185 |
| 2005/0212178 A1* | 9/2005 | Nien | B81C 1/0046 |
| | | | 264/408 |
| 2010/0101493 A1* | 4/2010 | Hodge | B05B 12/004 |
| | | | 118/697 |
| 2010/0110434 A1* | 5/2010 | Choi | B82Y 10/00 |
| | | | 356/401 |
| 2011/0180965 A1* | 7/2011 | Zhang | B82Y 10/00 |
| | | | 264/293 |
| 2011/0260361 A1 | 10/2011 | Im et al. | |
| 2014/0027955 A1* | 1/2014 | Wakabayashi | G03F 7/70 |
| | | | 264/447 |

FOREIGN PATENT DOCUMENTS

| | | | |
|---|---|---|---|
| JP | 2008006704 A | | 1/2008 |
| JP | 2011-100952 A | * | 5/2011 |
| JP | 2011100952 A | | 5/2011 |
| JP | 2012060074 A | | 3/2012 |
| WO | 2008129962 A1 | | 10/2008 |
| WO | 2011118006 A1 | | 9/2011 |
| WO | WO-2011-118006 | * | 9/2011 |
| WO | WO-2011-118006 A9 | * | 9/2011 |

OTHER PUBLICATIONS

International Search Report issued in PCT/JP2014/080833, dated Feb. 17, 2015. Form PCT/ISA/210.

Written Opinion issued in PCT/JP2014/080833, dated Feb. 17, 2015. Form PCT/ISA/220 and PCT/ISA/237.

* cited by examiner

IMPRINT APPARATUS, AND METHOD OF MANUFACTURING ARTICLE

TECHNICAL FIELD

The present invention relates to an imprint apparatus, and a method of manufacturing an article.

BACKGROUND ART

A photolithography technique is used to manufacture a device such as a semiconductor device. In this photolithography technique, a resist (photosensitive agent) on a substrate is exposed through a pattern on a mask (original) by an exposure apparatus, and a resist pattern is formed on the substrate by developing the resist. Then, a layer below the resist pattern is etched or ions are implanted into the layer by using the resist pattern as a mask.

Recently, an imprint technique in which a resin on a substrate is molded and cured by using a mold is attracting attention as another technique for manufacturing a device. In an imprint apparatus using this imprint technique, a force (release force) by which the mold and substrate pull against each other is generated when releasing the mold from the substrate (resin). This release force may deform (strain) the mold, thereby changing the shape of the resin pattern formed on the substrate. Therefore, U.S. Patent Application Publication No. 2011/0260361 has proposed a technique which deforms the substrate in accordance with the deformation of the mold by adjusting a holding force (for example, a chucking force) for holding the substrate, thereby reducing the change in pattern shape.

In this related art, however, even when the release operation is completed, a state in which the mold is not completely released from the substrate, that is, a portion of the substrate keeps sticking to the mold can occur. In this case, both a head holding the mold and a stage holding the substrate hold the mold and substrate, so it is not preferable to continue the imprint process in a state like this.

SUMMARY OF INVENTION

The present invention provides, for example, an imprint apparatus advantageous in terms of continuation of an imprint process after operation of releasing of a mold.

According to one aspect of the present invention, there is provided an imprint apparatus for performing an imprint process which includes molding of imprint material on a substrate with a mold and releasing of the mold from the molded imprint material, the apparatus including a substrate holder configured to hold the substrate, a mold holder configured to hold the mold, a driving device configured to perform driving, for the releasing of the mold, of at least one of the substrate holder and the mold holder, and a detector configured to detect completion of the releasing of the mold by the driving device.

Further aspects of the present invention will become apparent from the following description of exemplary embodiments with reference to the attached drawings.

DESCRIPTION OF EMBODIMENTS

Figure 1:
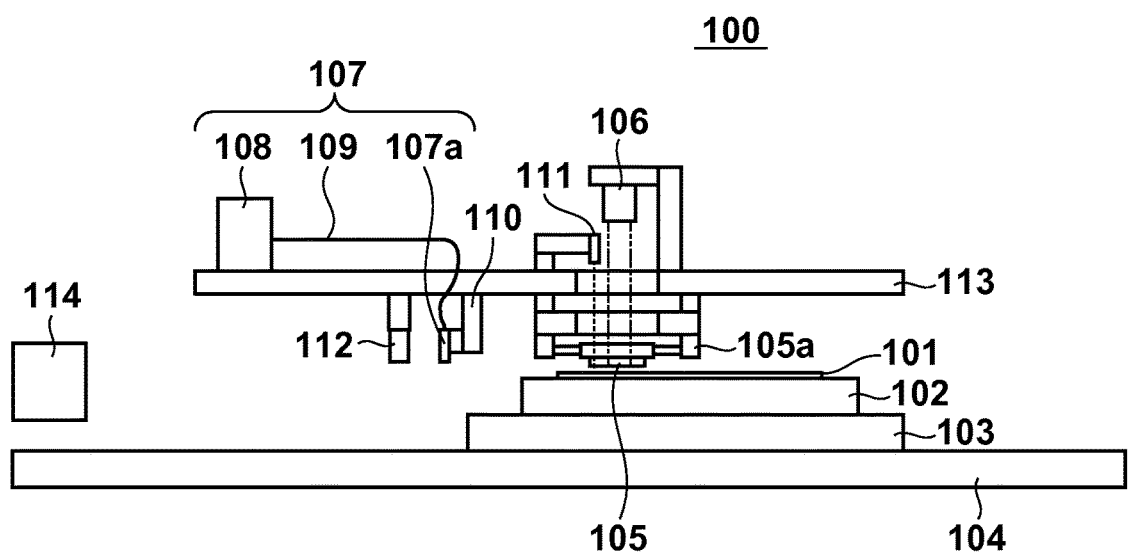
FIG. 1 is a schematic view showing the arrangement of an imprint apparatus as an aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of an imprint apparatus 100 as an aspect of the present invention. The imprint apparatus 100 is a lithography apparatus which performs an imprint process of forming a pattern on a substrate by molding and curing an imprint material (for example, a resin) on the substrate by using a mold.

The imprint apparatus 100 forms a pattern in each of a plurality of shot regions on the substrate by repeating the imprint process. The imprint process includes a molding operation of pressing the mold against the imprint material, a curing operation of curing the imprint material with the mold being pressed against the imprint material, and a release operation of releasing the mold from the cured resin.

In this embodiment, the imprint apparatus 100 adopts a photocuring method of curing an ultraviolet-curing resin as the imprint material by irradiation with ultraviolet light (UV light). However, the imprint apparatus 100 may also cure the resin by irradiation with light having a wavelength region different from the ultraviolet region, and may also cure the resin by using another energy (for example, heat).

The imprint apparatus 100 includes a substrate stage 103, mold stage 105a, irradiation unit 106, resin supply unit 107, alignment scope 111, focus sensor 112, and controller 114.

A substrate 101 is a substrate onto which a pattern of a mold 105 is transferred, that is, a substrate having a surface layer in which an element pattern corresponding to the pattern of the mold 105 is formed. The substrate stage 103 holds the substrate 101 via a substrate chuck (substrate holder) 102, and moves in an X-axis direction and a Y-axis direction perpendicular to the X-axis direction. The substrate stage 103 is arranged on a base frame 104.

The mold 105 has a projection-and-recess pattern on the surface. The pattern of the mold 105 is transferred onto the substrate 101 by sandwiching a resin between the mold 105 and substrate 101, and curing the resin. The mold stage 105a is a stage which includes a mold chuck (mold holder) and the like, and moves the mold 105 by holding it. For example, the mold stage 105a vertically moves (drives) the mold 105 in accordance with (the value of) a driving current given from a current amplifier or the like. The mold stage 105a implements the molding operation of pressing the mold 105 against an uncured resin on the substrate, and the release operation of releasing the mold 105 from a cured resin on the substrate.

The irradiation unit 106 irradiates an uncured resin on the substrate with ultraviolet light through the mold 105, thereby curing the resin. The irradiation unit 106 includes a light source such as a halogen lamp which generates an i-line or g-line, and an optical system for condensing and shaping the ultraviolet light from the light source.

The resin supply unit 107 has a function of supplying (applying) a predetermined amount of resin onto the substrate. For example, the resin supply unit 107 includes a tank 108 for storing an uncured resin, a dispenser 107a for forming droplets of the uncured resin and discharging (dispensing) the droplets, and a supply pipe 109 for supplying the resin stored in the tank 108 to the dispenser 107a.

Figure 2:
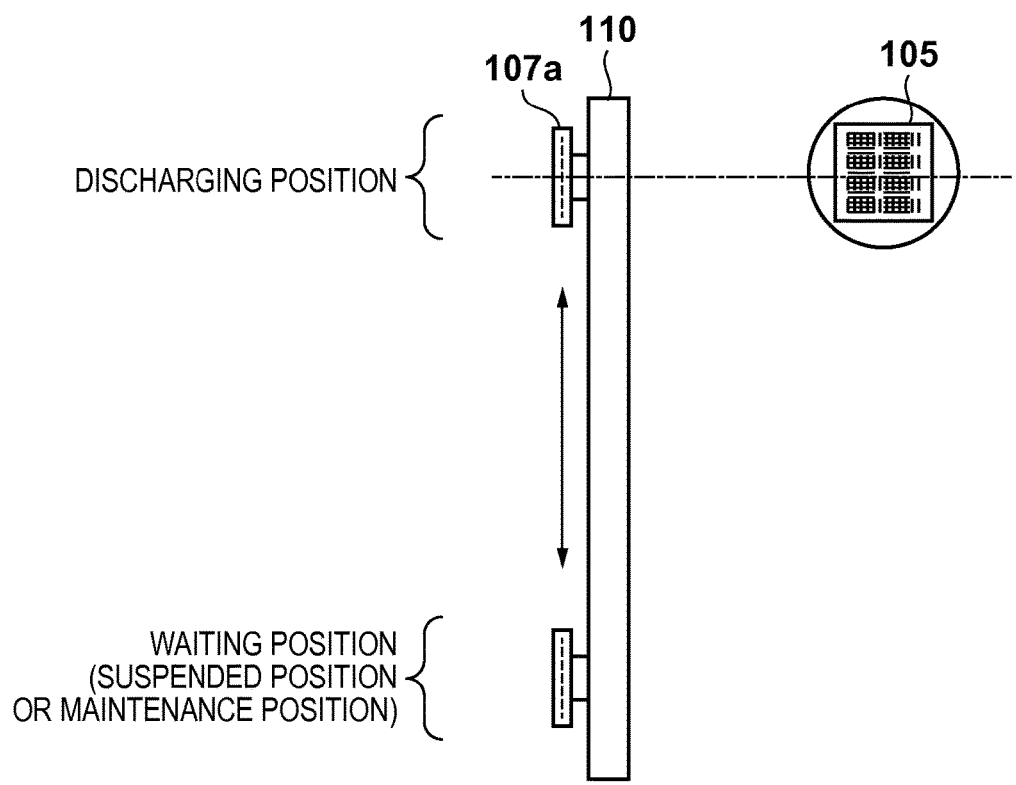
FIG. 2 is a view showing a discharging position and waiting position (suspended position) of a dispenser of the imprint apparatus shown in FIG. 1.

As shown in FIG. 2, a moving mechanism 110 moves the dispenser 107a between a discharging position and a waiting position (suspended position or maintenance position). The moving mechanism 110 moves the dispenser 107a to the discharging position in a normal discharging operation, and moves the dispenser 107a to the waiting position when performing maintenance. In the waiting position, the dispenser 107a is cleaned or replaced.

The alignment scope 111 is used to align the mold 105 and substrate 101 after an uncured resin is supplied onto the substrate. The alignment scope 111 detects an alignment mark formed on the mold 105 and an alignment mark formed on the substrate 101, and measures a positional shift (positional relationship) between the alignment marks.

The focus sensor 112 senses (detects) the position in the direction of height of the substrate 101 held by the substrate stage 103. The focus sensor 112 can also obtain the flatness of the substrate 101 by sensing the positions in the direction of height of a plurality of points on the substrate.

A platen 113 supports (fixes) the mold stage 105a, irradiation unit 106, dispenser 107a, tank 108, supply pipe 109, moving mechanism 110, alignment scope 111, and focus sensor 112.

The controller 114 includes a CPU, memory, and the like, and controls the whole (operation) of the imprint apparatus 100. For example, the controller 114 performs the imprint process (the molding operation, curing operation, and release operation) of forming a pattern on the substrate.

The imprint process in the imprint apparatus 100 will be explained with reference to FIGS. 3A to 3D and 4A to 4C. As described above, the controller 114 performs this imprint process by comprehensively controlling the individual units of the imprint apparatus 100.

Figure 3A:
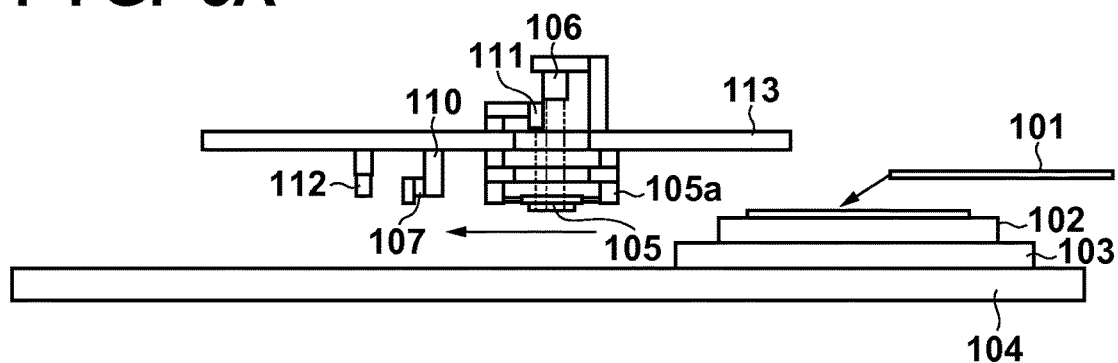
FIGS. 3A to 3D are views for explaining an imprint process in the imprint apparatus shown in FIG. 1.
Figure 3B:
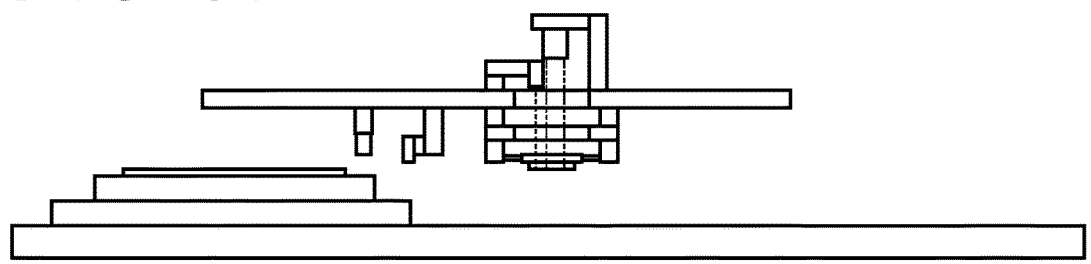

First, as shown in FIG. 3A, the substrate stage 103 holds the substrate 101 through the substrate chuck 102. Then, as shown in FIG. 3B, the substrate stage 103 is moved such that (a shot region of) the substrate 101 is positioned in the discharging position of the dispenser 107a. In addition, while the substrate stage 103 is moved from the state shown in FIG. 3A to the state shown in FIG. 3B, the focus sensor 112 senses the position in the vertical direction and the flatness of the substrate 101. When there is no problem in the flatness of the substrate 101, a resin is supplied to the substrate 101.

Figure 3C:
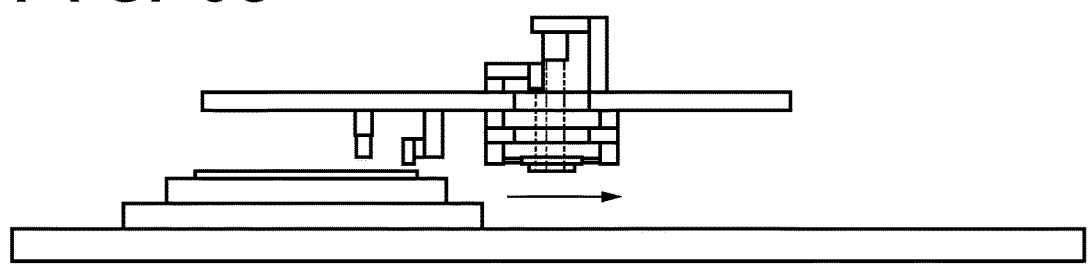
Figure 5:
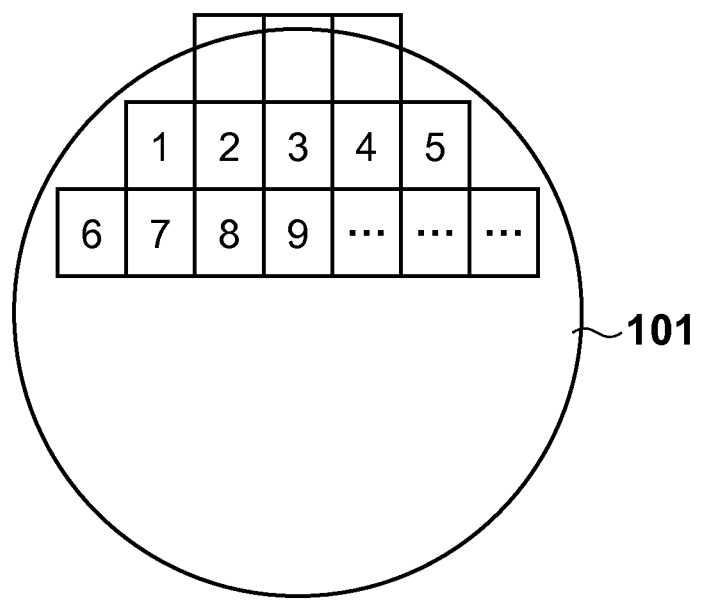
FIG. 5 is a view showing the layout of shot regions on a substrate.

Subsequently, as shown in FIG. 3C, the substrate stage 103 is moved while the dispenser 107a is discharging (dispensing) an uncured resin, thereby supplying (applying) a predetermined amount of resin onto (the shot region of) the substrate. As shown in FIG. 5, a plurality of shot regions are arranged on the substrate, and the imprint process is (continuously) performed in these shot regions in the order of shot numbers 1, 2, 3, . . . , n.

Figure 3D:
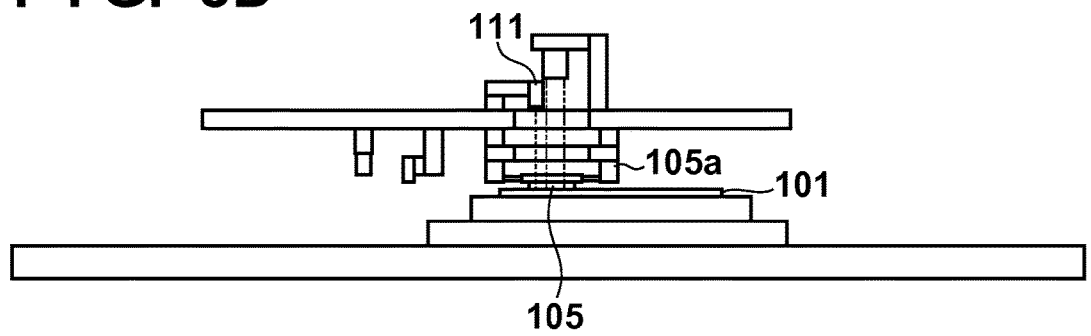
Figure 4A:
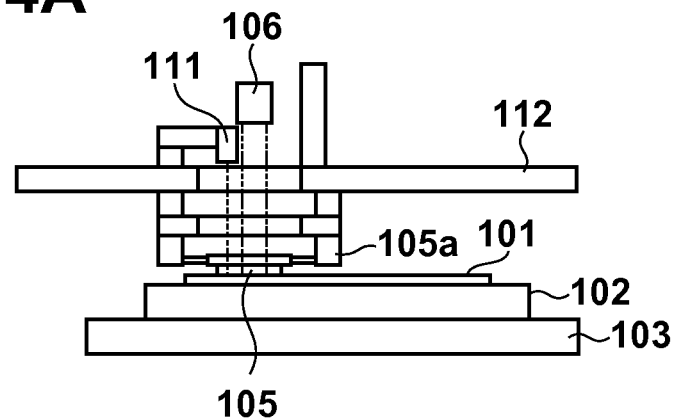
FIGS. 4A to 4C are views for explaining the imprint process in the imprint apparatus shown in FIG. 1.

As shown in FIGS. 3D and 4A, the substrate stage 103 is so moved that (the shot region in which the resin is supplied of) the substrate 101 is positioned below (in the molding position) of the mold 105. Then, the mold stage 105a moves the mold 105 downward, and presses the mold 105 against the resin on the substrate (the substrate 101) (that is, brings the mold 105 into contact with the resin on the substrate). While the mold 105 and the resin on the substrate are in contact with each other, the alignment scope 111 detects the alignment mark of the mold 105 and the alignment mark of the substrate 101, thereby adjusting the relative positions of the mold 105 and substrate 101.

Figure 4B:
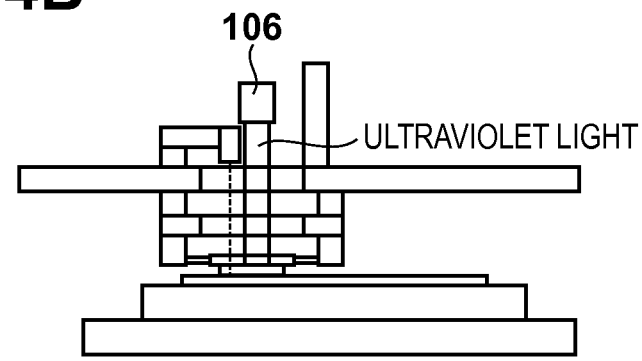

As shown in FIG. 4B, while the mold 105 and the resin on the substrate are in contact with each other, the resin on the substrate is irradiated with the light from the irradiation unit 106 through the mold 105. In this manner, the resin on the substrate cures.

Figure 4C:
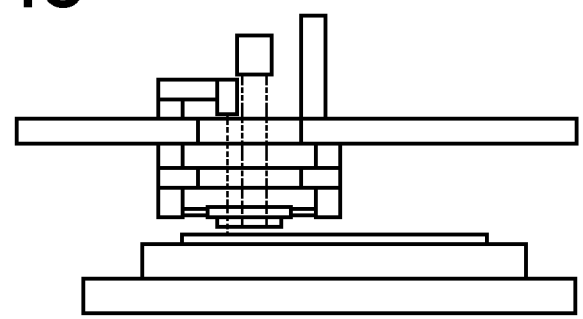

Finally, as shown in FIG. 4C, the mold stage 105a raises the mold 105, thereby releasing it from the cured resin on the substrate. Consequently, the patterned resin is formed on the substrate 101 (that is, the pattern of the mold 105 is transferred onto the substrate 101), and the imprint process is terminated.

Figure 6A:
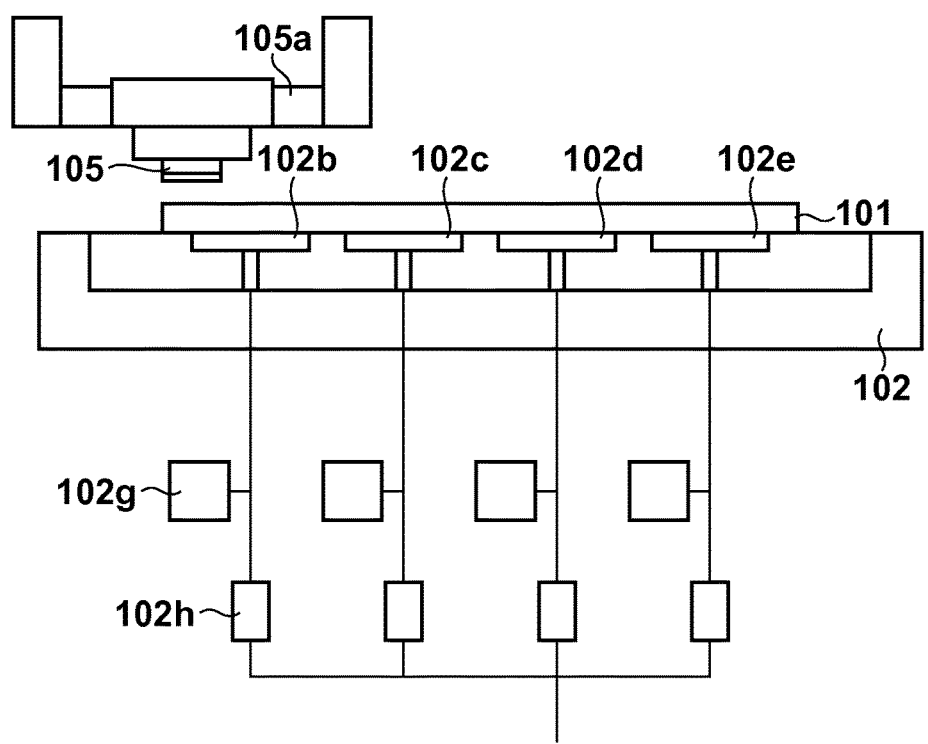
FIGS. 6A and 6B are views for explaining a release operation of releasing a mold from a cured resin on a substrate.

The release operation of releasing the mold 105 from the cured resin on the substrate in the above-described imprint process will be explained in detail below. FIG. 6A is a view showing the state in which the substrate 101 is held by the substrate chuck 102. As shown in FIG. 6A, the substrate chuck 102 includes vacuum lines 102b to 102e for chucking the substrate 101 by vacuum suction. A pressure detector 102g is connected to each vacuum line. When the substrate 101 is chucked by vacuum suction, the pressure detector 102g detects the vacuum state of each of the vacuum lines 102b to 102e, that is, detects the value of the internal pressure (air pressure) of each of the vacuum lines 102b to 102e. In addition, a pressure regulator 102h for regulating the vacuum pressure of each of the vacuum lines 102b to 102e is inserted in it.

Figure 6B:
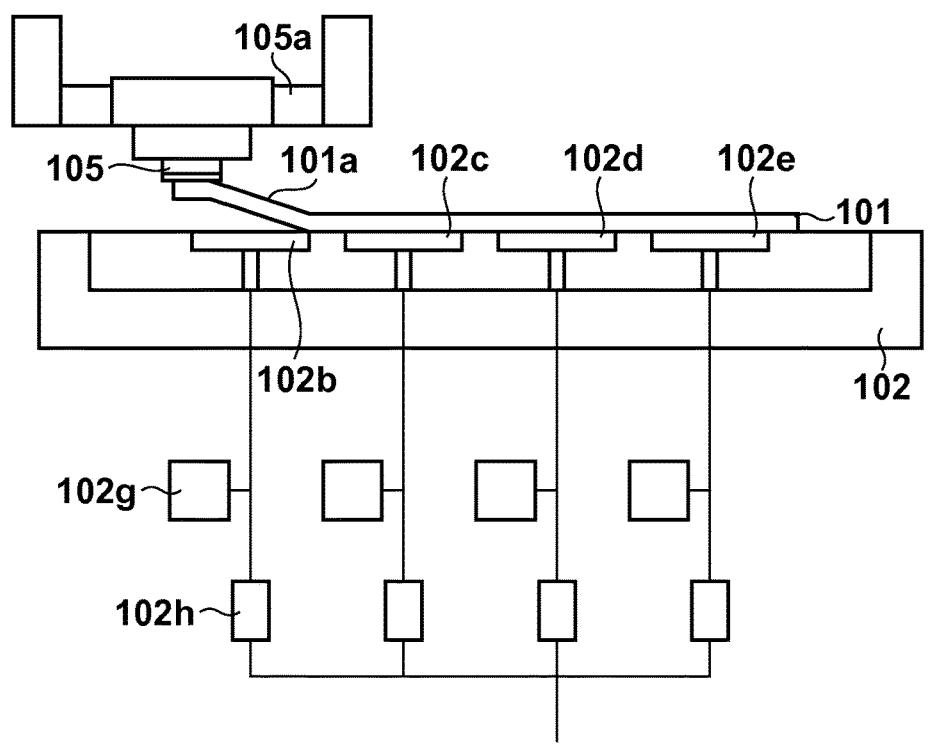

FIG. 6B is a view showing the state after the release operation of releasing the mold 105 from the cured resin on the substrate is performed. Referring to FIG. 6B, the imprint process is performed in a peripheral shot region arranged in the periphery of the substrate 101. Before the release operation of releasing the mold 105 from the cured resin on the substrate is performed, holding (chucking) of a periphery 101a of the substrate 101 is canceled by regulating the value of the internal pressure of one of the vacuum lines 102b to 102e, for example, the vacuum line 102b. In the release operation, therefore, the periphery 101a of the substrate 101 partially floats, so a fall of the pattern formed on the substrate can be reduced.

When the release operation is normally performed, the substrate 101 peels off by its own weight from the mold 105, and returns from the state shown in FIG. 6B to the state shown in FIG. 6A, so the imprint process can be continued. However, if the release force is larger than a repulsive force from the mold 105, which is obtained by the weight of the substrate 101, the release operation is terminated in a state in which the mold 105 is not completely released from the substrate 101, that is, in a state in which a portion of the substrate 101 keeps sticking to the mold. Also, if a defect of the imprint process makes the release force larger than the force with which the substrate stage 103 holds the substrate

101, the release operation is terminated while a portion of the substrate 101 keeps sticking to the mold, even when holding of the substrate 101 is not canceled. The release force herein mentioned is a force generated between the mold 105 and substrate 101 in a direction in which they pull against each other.

Accordingly, as will be explained in each of the following embodiments, the imprint apparatus 100 includes a detector for detecting whether the mold 105 is released from the cured resin on the substrate, after the release operation of releasing the mold 105 from the cured resin is performed.

<First Embodiment>

Figure 7A:
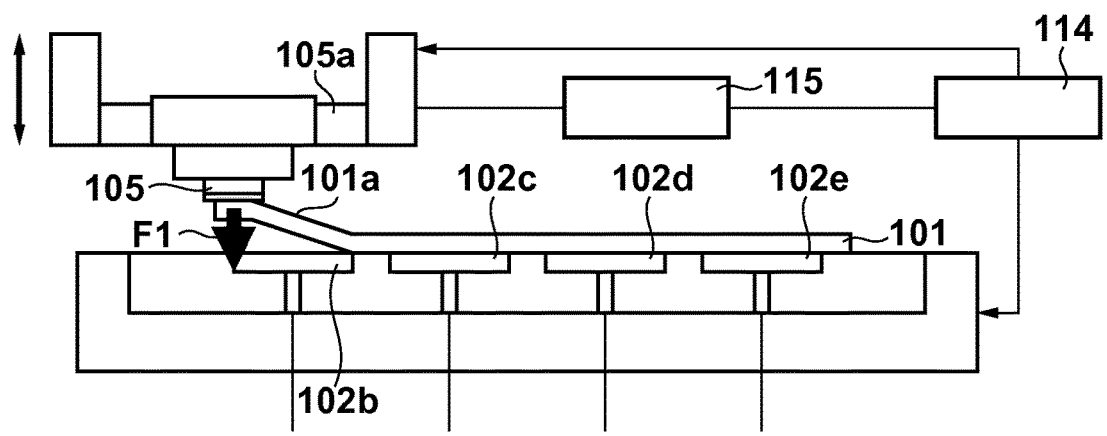
FIGS. 7A and 7B are views showing the arrangement of a detector according to the first embodiment.

FIG. 7A is a view showing an example of the arrangement of the detector for detecting whether the mold 105 is released from the cured resin on the substrate (that is, the completion of the release of the mold 105). FIG. 7A shows a case in which the mold stage 105a holding the mold 105 vertically moves, thereby pressing the mold 105 against the resin on the substrate.

Assume that the positioning of the mold stage 105a in each operation is performed by servo control. In this case, in the state shown in FIG. 6A (that is, in the waiting position (designed position) of the mold stage 105a in a normal state), a driving current to be supplied to the mold stage 105a has a current value for holding the weight of the mold stage 105a. This driving current to be supplied to the mold stage 105a is actually an electric current to be supplied to a driver such as an actuator for driving the mold stage 105a.

On the other hand, in the state shown in FIG. 7A, a portion (the periphery 101a) of the substrate 101 is sticking to the mold 105, so the mold stage 105a and substrate stage 103 are holding the periphery 101a of the substrate 101. Accordingly, a force (load) F1 which pulls the mold 105 in the direction of the substrate stage 103 is generated in the mold stage 105a. In this case, it is necessary to compensate for the force F1 pulling the mold 105 in addition to the weight of the mold stage 105a. Therefore, the driving current to be supplied to the mold stage 105a in the state shown in FIG. 7A is larger, by the amount for compensating for the force F1 which pulls the mold 105, than the driving current to be supplied to the mold stage 105a in the state shown in FIG. 6A.

In this embodiment, therefore, a current detector 115 detects (monitors) the value (current value) of the driving current to be supplied to the mold stage 105a, thereby detecting whether the mold 105 is released from the cured resin on the substrate. For example, the value of the driving current detected by the current detector 115 after the release operation is performed is sometimes larger than that of the driving current to be supplied to the substrate stage 103 when the mold 105 is not in contact with the resin on the substrate (that is, in the state shown in FIG. 6A). In this case, it is determined that the mold 105 is not released from the cured resin on the substrate. The controller 114 performs this determination based on the value of the driving current detected by the current detector 115.

In this embodiment as described above, the controller 114 functions as a detector for detecting whether the mold 105 is released from the cured resin on the substrate, in cooperation with the current detector 115. Also, if the controller 114 determines that the mold 105 is not released from the cured resin on the substrate, the controller 114 performs a process of releasing the mold 105 from the cured resin, or ceases the imprint process (functions as a processor).

Figure 7B:
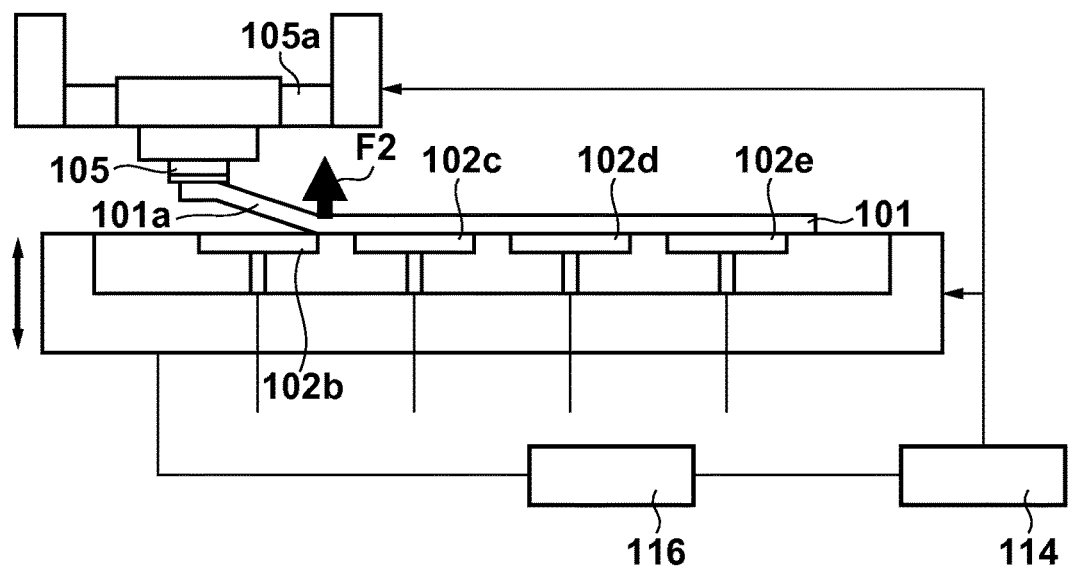

FIG. 7B is a view showing another example of the arrangement of the detector for detecting whether the mold 105 is released from the cured resin on the substrate. FIG. 7B shows a case in which the substrate stage 103 holding the substrate 101 vertically moves, thereby pressing the mold 105 against the resin on the substrate.

Assuming that the positioning of the substrate stage 103 in each operation is performed by servo control as in the above case, a force (load) F2 which pulls the substrate 101 toward the mold stage 105a is generated in the substrate stage 103. In the same manner as described above, therefore, a current detector 116 detects (monitors) the value (current value) of a driving current to be supplied to the substrate stage 103. This makes it possible to detect whether the mold 105 is released from the cured resin on the substrate. For example, the value of the driving current detected by the current detector 116 after the release operation is performed is sometimes larger than that of the driving current to be supplied to the substrate stage 103 when the mold 105 is not in contact with the resin on the substrate (that is, in the state shown in FIG. 6A). In this case, it is determined that the mold 105 is not released from the cured resin on the substrate. The controller 114 performs this determination based on the value of the driving current detected by the current detector 116. Note that the driving current to be supplied to the substrate stage 103 is actually an electric current to be supplied to a driver such as an actuator for driving the substrate stage 103.

<Second Embodiment>

Figure 8A:
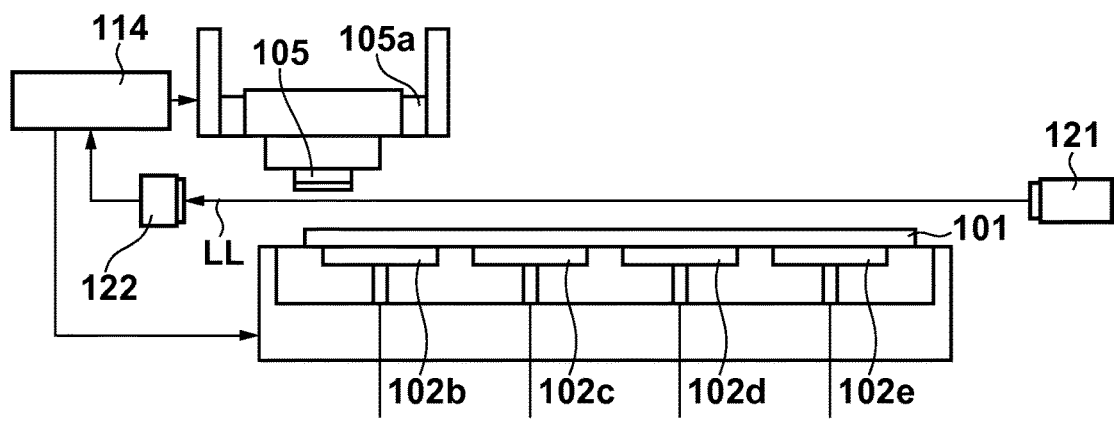
FIGS. 8A and 8B are views showing the arrangement of a detector according to the second embodiment.
Figure 8B:
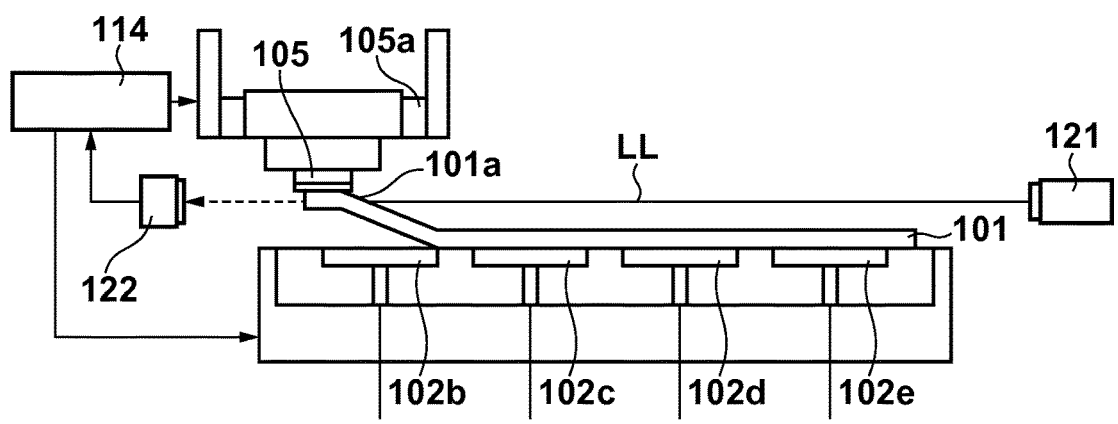

FIGS. 8A and 8B are views showing an example of the arrangement of a detector for detecting whether the mold 105 is released from the cured resin on the substrate. In this embodiment, as shown in FIG. 8A, the imprint apparatus 100 includes a light source 121 for emitting light so that the light passes through the space between the mold 105 and substrate 101, and a sensor 122 for sensing light LL emitted from the light source 121.

FIG. 8A shows a state after the release operation of releasing the mold 105 from the cured resin on the substrate is normally performed. In this state shown in FIG. 8A, the substrate 101 is not sticking to the mold 105, so there is no obstacle between the mold 105 and substrate 101, and the sensor 122 can sense the light LL from the light source 121.

On the other hand, in a state shown in FIG. 8B, a portion (the periphery 101a) of the substrate 101 is sticking to the mold 105, so the substrate 101 intercepts the light LL emitted from the light source 121, and the sensor 122 cannot sense the light LL.

In this embodiment, therefore, the sensor 122 senses (monitors) the light LL from the light source 121, thereby detecting whether the mold 105 is released from the cured resin on the substrate. For example, if the sensor 122 does not sense the light LL emitted from the light source 121 after the release operation is performed, it is determined that the mold 105 is not released from the cured resin on the substrate. The controller 114 performs this determination based on the sensing result from the sensor 122.

In this embodiment as described above, the controller 114 functions as a detector for detecting whether the mold 105 is released from the cured resin on the substrate, in cooperation with the light source 121 and sensor 122. Also, if the controller 114 determines that the mold 105 is not released from the cured resin on the substrate, the controller 114 performs a process of releasing the mold 105 from the cured resin, or ceases the imprint process.

<Third Embodiment>

Figure 9A:
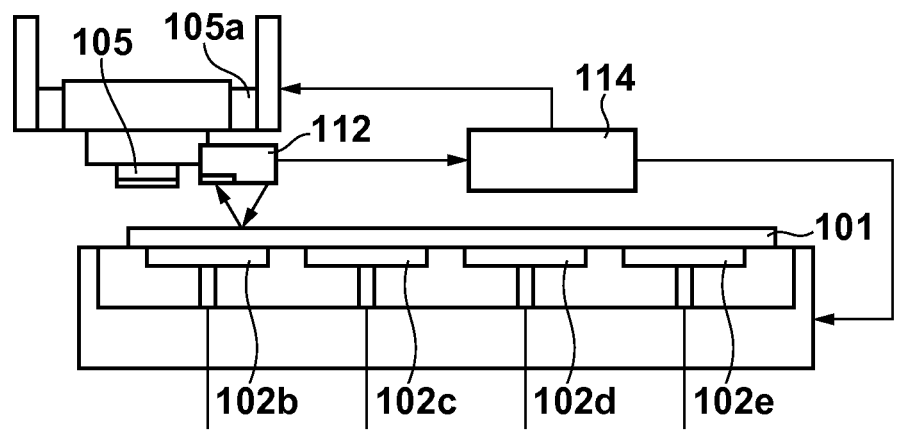
FIGS. 9A and 9B are views showing the arrangement of a detector according to the third embodiment.
Figure 9B:
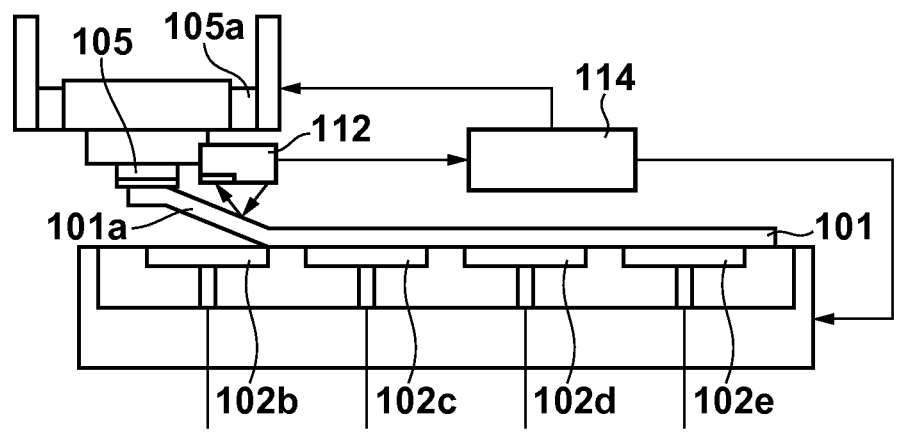

FIGS. 9A and 9B are views showing an example of the arrangement of a detector for detecting whether the mold 105 is released from the cured resin on the substrate. This embodiment uses the focus sensor 112 for sensing the position of the substrate 101 in the direction of height (the direction perpendicular to the holding surface of the substrate chuck 102) and the flatness of the substrate 101.

FIG. 9A shows a state after the release operation of releasing the mold 105 from the cured resin on the substrate is normally performed. In this state shown in FIG. 9A, the substrate 101 is not sticking to the mold 105. Accordingly, the sensing results (the position of the substrate 101 in the direction of height and the flatness of the substrate 101) obtained by the focus sensor 112 do not largely change from the sensing results obtained by the focus sensor 112 when the substrate stage 103 is holding the substrate 101.

On the other hand, FIG. 9B shows a state in which a portion (the periphery 101a) of the substrate 101 is sticking to the mold 105 after the release operation is performed. In this state shown in FIG. 9B, the periphery 101a of the substrate 101 floats from the substrate stage 103. Accordingly, the sensing results obtained by the focus sensor 112 in the state shown in FIG. 9B largely change from the sensing results obtained by the focus sensor 112 when the substrate stage 103 is holding the substrate 101.

In this embodiment, therefore, the focus sensor 112 senses (monitors) the position of the substrate 101 in the direction of height and the flatness of the substrate 101, thereby detecting whether the mold 105 is released from the cured resin on the substrate. For example, the sensing results obtained by the focus sensor 112 after the release operation is performed sometimes differ (largely change) from the focusing results obtained by the focus sensor 112 when the mold 105 is not in contact with the resin on the substrate. In this case, it is determined that the mold 105 is not released from the cured resin on the substrate. The controller 114 performs this determination based on the sensing results obtained by the focus sensor 112.

Also, the sensing point of the focus sensor 112 is preferably a point in a region around a shot region on the substrate in which the imprint process is being performed (for example, a point outside the shot region). As a consequence, if the mold 105 is not released from the cured resin on the substrate, the sensing results obtained by the focus sensor 112 largely change. Therefore, it is possible to accurately detect whether the mold 105 is released from the cured resin on the substrate.

In this embodiment as described above, the controller 114 functions as a detector for detecting whether the mold 105 is released from the cured resin on the substrate, in cooperation with the focus sensor 112. Also, if the controller 114 determines that the mold 105 is not released from the cured resin on the substrate, the controller 114 performs a process of releasing the mold 105 from the cured resin, or ceases the imprint process.

<Fourth Embodiment>

Figure 10A:
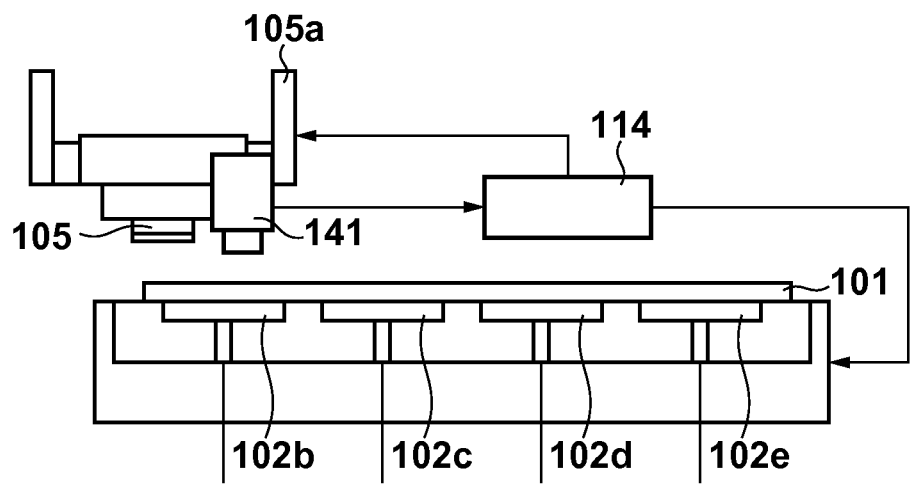
FIGS. 10A and 10B are views showing the arrangement of a detector according to the fourth embodiment.
Figure 10B:
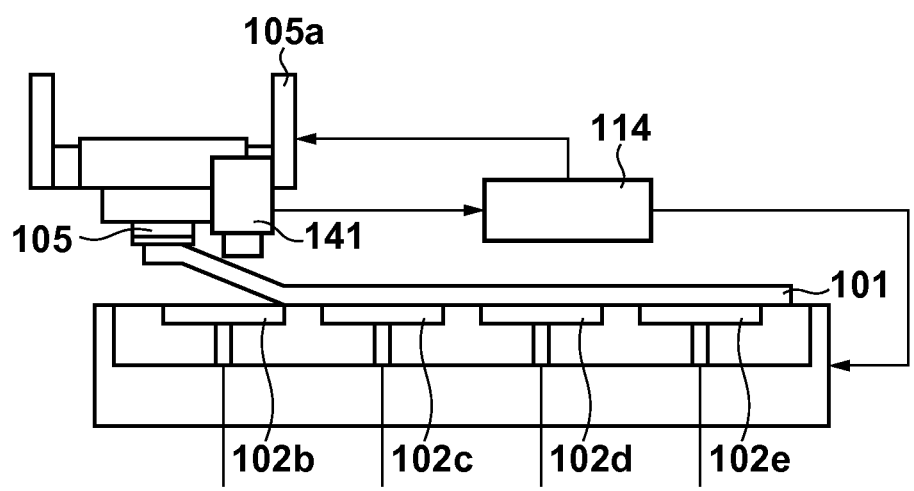

FIGS. 10A and 10B are views showing an example of the arrangement of a detector for detecting whether the mold 105 is released from the cured resin on the substrate. In this embodiment, as shown in FIGS. 10A and 10B, the imprint apparatus 100 includes an image sensor 141 for sensing an image of the surface of the substrate 101 held by the substrate stage 103.

FIG. 10A shows a state after the release operation of releasing the mold 105 from the cured resin on the substrate is normally performed. In this state shown in FIG. 10A, the substrate 101 is not sticking to the mold 105. Therefore, the surface image of the substrate 101 sensed by the image sensor 141 does not largely change from the surface image of the substrate 101 sensed by the image sensor 141 when the substrate stage 103 is holding the substrate 101.

On the other hand, FIG. 10B shows a state in which a portion (the periphery 101a) of the substrate 101 is sticking to the mold 105 after the release operation is performed. In this state shown in FIG. 10B, the periphery 101a of the substrate 101 floats from the substrate stage 103. Accordingly, in the state shown in FIG. 10B, the surface image of the substrate 101 sensed by the image sensor 141 largely changes from the surface image of the substrate 101 sensed by the image sensor 141 when the substrate stage 103 is holding the substrate 101. More specifically, in the surface image of the substrate 101 sensed by the image sensor 141 in the state shown in FIG. 10B, color variations and interference fringes are observed in accordance with the deformation of the substrate 101.

In this embodiment, therefore, whether the mold 105 is released from the cured resin on the substrate is determined by sensing (monitoring) the surface image of the substrate 101 by the image sensor 141. For example, the surface image of the substrate 101 sensed by the image sensor 141 after the release operation is performed sometimes differs (largely changes) from the surface image of the substrate 101 sensed by the image sensor 141 when the mold 105 is not in contact with the resin on the substrate. In this case, it is determined that the mold 105 is not released from the cured resin on the substrate. The controller 114 performs this determination based on the surface image of the substrate 101 sensed by the image sensor 141.

Also, the image sensing region to be sensed by the image sensor 141 is preferably a region around a shot region on the substrate in which the imprint process is being performed (a point outside the shot region). Consequently, the surface image of the substrate 101 sensed by the image sensor 141 largely changes if the mold 105 is not released from the cured resin on the substrate. Accordingly, it is possible to more accurately detect whether the mold 105 is released from the cured resin on the substrate.

In this embodiment as described above, the controller 114 functions as a detector for detecting whether the mold 105 is released from the cured resin on the substrate, in cooperation with the image sensor 141. Also, if the controller 114 determines that the mold 105 is not released from the cured resin on the substrate, the controller 114 performs a process of releasing the mold 105 from the cured resin, or ceases the imprint process.

<Fifth Embodiment>

Figure 11A:
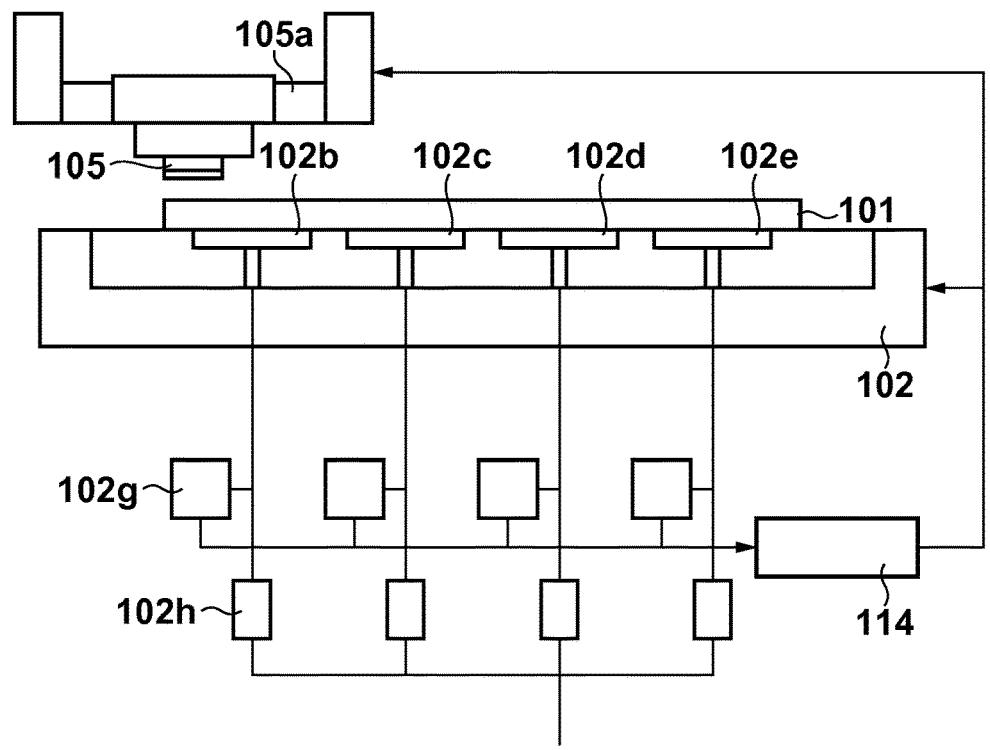
FIGS. 11A and 11B are views showing the arrangement of a detector according to the fifth embodiment.
Figure 11B:
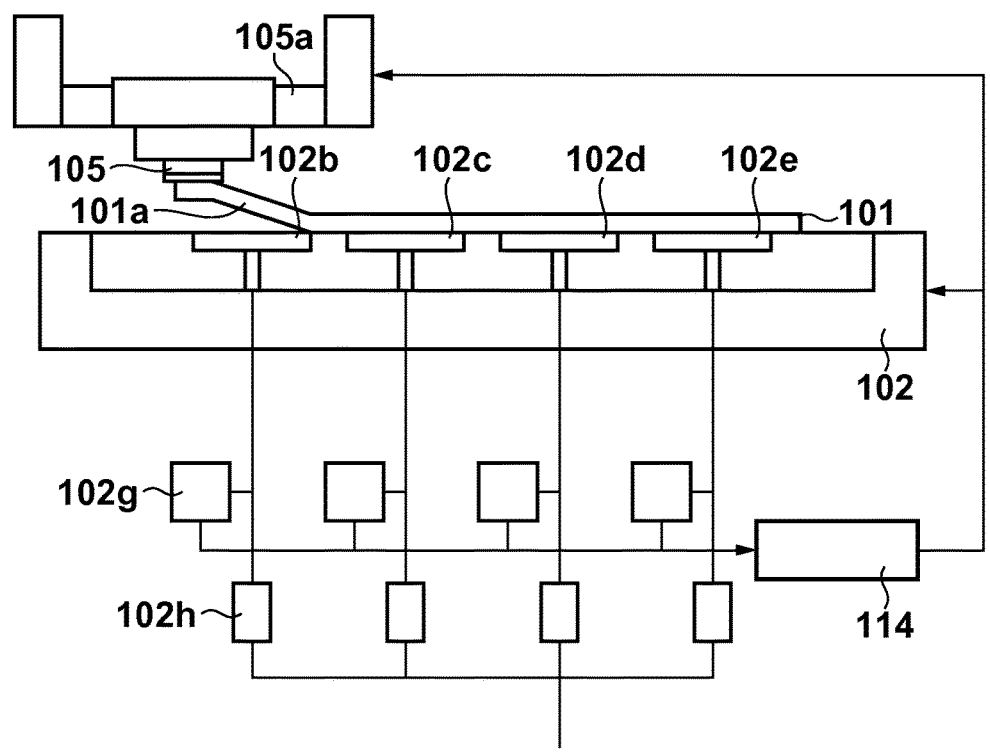

FIGS. 11A and 11B are views showing an example of the arrangement of a detector for detecting whether the mold 105 is released from the cured resin on the substrate. This embodiment uses the pressure detector 102g for detecting the value of the internal pressure of each of the vacuum lines 102b to 102e when the substrate 101 is chucked by vacuum suction.

FIG. 11A shows a state after the release operation of releasing the mold 105 from the cured resin on the substrate is normally performed. In this state shown in FIG. 11A, the substrate 101 is not sticking to the mold 105, so the value of the pressure detected by the pressure detector 102g indicates that the substrate 101 is chucked by vacuum suction (that is, the substrate 101 is normally held).

On the other hand, FIG. 11B shows a state in which a portion (the periphery 101a) of the substrate 101 is sticking to the mold 105. In this state shown in FIG. 11B, the periphery 101a of the substrate 101 floats from the substrate stage 103, so the vacuum line 102b has failed to chuck the substrate 101. Accordingly, the value of the pressure detected by the pressure detector 102g indicates that the substrate 101 is not chucked by vacuum suction (that is, the substrate 101 is not normally held).

In this embodiment, therefore, the pressure detector 102g detects (monitors) the value of the internal pressure of each of the vacuum lines 102b to 102e, thereby detecting whether the mold 105 is released from the cured resin on the substrate. For example, the value of the pressure detected by the pressure detector 102g after the release operation is performed sometimes differs (largely changes) from the value of the pressure detected by the pressure detector 102g when the mold 105 is not in contact with the resin on the substrate. In this case, it is determined that the mold 105 is not released from the cured resin on the substrate. The controller 114 performs this determination based on the value of the pressure detected by the pressure detector 102g.

In this embodiment as described above, the controller 114 functions as a detector for detecting whether the mold 105 is released from the cured resin on the substrate, in cooperation with the pressure detector 102g. Also, if the controller 114 determines that the mold 105 is not released from the cured resin on the substrate, the controller 114 performs a process of releasing the mold 105 from the cured resin, or ceases the imprint process.

In the imprint apparatus 100 as has been explained in each embodiment, after the release operation of releasing the mold 105 from the cured resin on the substrate is performed, whether the mold 105 is released from the cured resin can be detected.

A practical example of the process of releasing the mold 105 from the cured resin on the substrate if it is determined that the mold 105 is not released from the cured resin will be explained below with reference to FIGS. 12A to 12D.

Figure 12A:
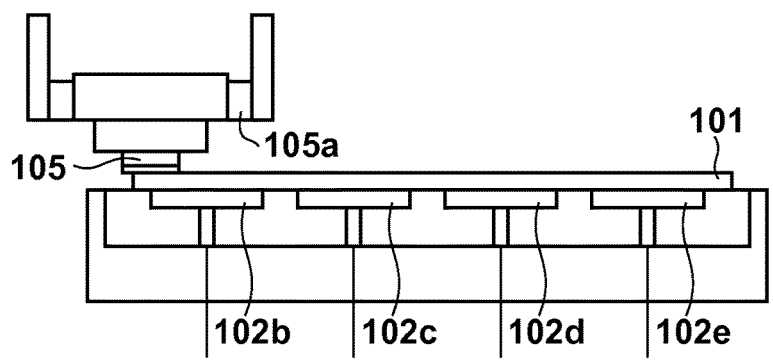
FIGS. 12A to 12D are views for explaining a process of releasing a mold from a cured resin on a substrate.

FIG. 12A is a view showing a state in which the resin on the substrate is irradiated with light from the irradiation unit 106 while the mold 105 is moved down and pressed against the resin on the substrate by the mold stage 105a. In this state shown in FIG. 12A, the pattern of the mold 105 is transferred onto the substrate.

Figure 12B:
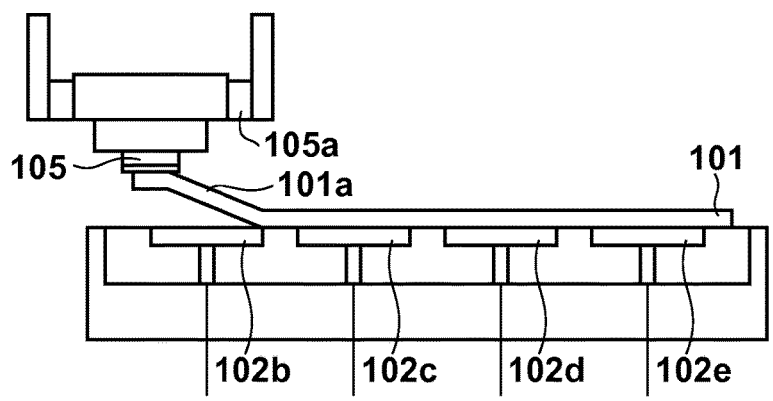

FIG. 12B is a view showing a state in which the mold 105 is raised and released from the cured resin on the substrate by the mold stage 105a. In this state, the holding of the periphery 101a of the substrate 101 is canceled by regulating the value of the internal pressure of the vacuum line 102b as described earlier. In the release operation, therefore, the periphery 101a of the substrate 101 partially floats (that is, the periphery 101a of the substrate 101 is strained), and a fall of the pattern formed on the substrate can be reduced. When the release operation is normally performed, the substrate 101 is released by its own weight from the mold 105. As described previously, however, the release operation is sometimes terminated with a portion of the substrate 101 sticking to the mold.

Figure 12C:
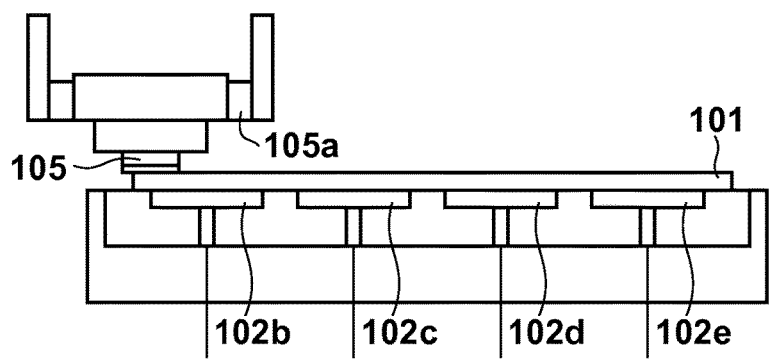

Accordingly, after the release operation of releasing the mold 105 from the cured resin on the substrate is performed, whether the mold 105 is released from the cured resin is detected. If it is determined that the mold 105 is not released from the cured resin on the substrate, as shown in FIG. 12C, the mold stage 105a is moved (down) toward the substrate 101, thereby bringing the periphery 101a of the substrate 101 into contact with the substrate stage 103. In other words, the state shown in FIG. 12B is returned to the state shown in FIG. 12C by vertically moving the mold stage 105a or substrate stage 103.

In the state shown in FIG. 12C, the force with which the substrate stage 103 holds (the periphery 101a of) the substrate 101 is made larger than a predetermined holding force (for example, the preceding holding force), so that the substrate stage 103 normally holds the substrate 101. More specifically, the value of the internal pressure of the vacuum line 102b is regulated by the pressure regulator 102h so as to make the force of holding the periphery 101a of the substrate 101 larger than the predetermined holding force. The predetermined holding force herein mentioned is set at strength which prevents the substrate 101 from peeling off from the substrate stage 103 even when the mold stage 105a or substrate stage 103 is vertically moved.

Figure 12D:
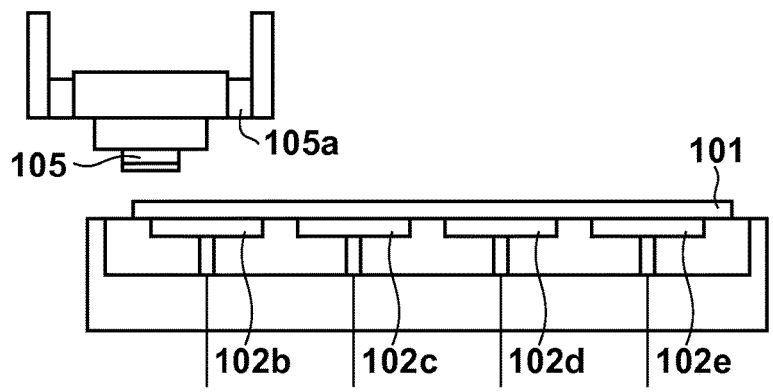

After the force with which the substrate stage 103 holds the substrate 101 is made larger than the predetermined holding force, as shown in FIG. 12D, the mold 105 is raised and released from the cured resin on the substrate by the mold stage 105a. Since the force with which the substrate stage 103 holds the substrate 101 is made larger than the predetermined holding force as described above, the substrate 101 peels off from the mold 105 while maintaining the state in which the substrate 101 is held on the substrate stage 103. Note that in the state shown in FIG. 12D, it is also possible to redetect whether the mold 105 is released from the cured resin on the substrate.

The imprint apparatus 100 detects whether the mold is completely released from the substrate after the release operation is performed, and can prevent the continuation of the imprint process in a state in which the mold is not completely released from the substrate. Accordingly, the imprint apparatus 100 can reduce damage to the mold or substrate caused when the mold is not completely released from the substrate, and can economically provide an article such as a high-quality semiconductor device with a high throughput. A method of manufacturing a device (for example, a semiconductor device, magnetic storage medium, or liquid crystal display element) as an article will be explained. This manufacturing method includes a step of forming a pattern on a substrate (for example, a wafer, glass substrate, or film-like substrate) by using the imprint apparatus 100. The manufacturing method further includes a step of developing the substrate on which the pattern is formed. The article manufacturing method according to this embodiment is more advantageous than conventional methods in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-254490 filed Dec. 9, 2013, which is hereby incorporated by reference herein in its entirety.

The invention claimed is:

1. An imprint apparatus for performing an imprint process which includes molding of imprint material on a substrate with a mold and releasing of the mold from the molded imprint material, the apparatus comprising:
   a substrate holder configured to hold the substrate;
   a mold holder configured to hold the mold;
   a driving device configured to perform driving, for the releasing of the mold, of at least one of the substrate holder and the mold holder;
   a detector configured to detect whether a light has passed between the substrate holder and the mold holder; and
   a controller configured to determine whether the releasing of the mold has been completed by the driving device in a state in which the substrate does not stick to the mold via the molded imprint material based on a detection result obtained by the detector.

2. The apparatus according to claim 1, wherein in a case where the controller determines that the releasing of the mold has not been completed, the controller is configured to cause the driving device to perform the driving for the releasing of the mold again.

3. The apparatus according to claim 2, wherein the controller is configured to make, during the driving for the releasing of the mold again, a force, with which the substrate holder holds the substrate, larger than that during the last driving for the releasing of the mold.

4. The apparatus according to claim 1, wherein in a case where the controller determines that the releasing of the mold has not been completed, the controller is configured to cease the imprint process.

5. The apparatus according to claim 1, wherein the controller is configured to cancel attraction of the substrate by the substrate holder, during the driving for the releasing of the mold, with respect to a region on the substrate for which the imprint process is being performed.

6. An imprint apparatus for performing an imprint process which includes molding of imprint material on a substrate with a mold and releasing of the mold from the molded imprint material, the apparatus comprising:
a substrate holder configured to hold the substrate;
a mold holder configured to hold the mold;
a driving device configured to perform driving, for the releasing of the mold, of at least one of the substrate holder and the mold holder;
a detector configured to detect a position of a surface of the substrate in a direction perpendicular to a holding surface of the substrate holder, the detected position of the surface of the substrate being a portion of the surface of the substrate that is disposed outside a region of the substrate in which the imprint process is being performed; and
a controller configured to determine whether the releasing of the mold has been completed by the driving device in a state in which the substrate does not stick to the mold via the molded imprint material based on the position of the surface of the substrate detected by the detector.

7. The apparatus according to claim 6, wherein in a case where the controller determines that the releasing of the mold has not been completed, the controller is configured to cause the driving device to perform the driving for the releasing of the mold again.

8. The apparatus according to claim 6, wherein in a case where the controller determines that the releasing of the mold has not been completed, the controller is configured to cease the imprint process.

9. The apparatus according to claim 6, wherein the controller is configured to cancel attraction of the substrate by the substrate holder, during the driving for the releasing of the mold, with respect to a region on the substrate for which the imprint process is being performed.

10. An imprint apparatus for performing an imprint process which includes molding of imprint material on a substrate with a mold and releasing of the mold from the molded imprint material, the apparatus comprising:
a substrate holder configured to hold the substrate;
a mold holder configured to hold the mold;
a driving device configured to perform driving, for the releasing of the mold, of at least one of the substrate holder and the mold holder;
a detector configured to obtain image data by taking an image of a surface of the substrate that is disposed outside a region of the substrate in which the imprint process is being performed; and
a controller configured to determine whether the releasing of the mold has been completed by the driving device in a state in which the substrate does not stick to the mold via the molded imprint material based on the image data obtained by the detector.

11. The apparatus according to claim 10, wherein in a case where the controller determines that the releasing of the mold has not been completed, the controller is configured to cause the driving device to perform the driving for the releasing of the mold again.

12. The apparatus according to claim 10, wherein in a case where the controller determines that the releasing of the mold has not been completed, the controller is configured to cease the imprint process.

13. The apparatus according to claim 10, wherein the controller is configured to cancel attraction of the substrate by the substrate holder, during the driving for the releasing of the mold, with respect to a region on the substrate for which the imprint process is being performed.

14. An imprint apparatus for performing an imprint process which includes molding of imprint material on a substrate with a mold and releasing of the mold from the molded imprint material, the apparatus comprising:
a substrate holder configured to hold the substrate;
a mold holder configured to hold the mold;
a driving device configured to perform driving, for the releasing of the mold, of at least one of the substrate holder and the mold holder;
a vacuum line configured to cause the substrate holder to hold the substrate;
a detector configured to detect a gas pressure in the vacuum line; and
a controller configured to determine whether the releasing of the mold has been completed by the driving device in a state in which the substrate does not stick to the mold via the molded imprint material based on the gas pressure in the vacuum line detected by the detector.

15. The apparatus according to claim 14, wherein in a case where the controller determines that the releasing of the mold has not been completed, the controller is configured to cause the driving device to perform the driving for the releasing of the mold again.

16. The apparatus according to claim 14, wherein in a case where the controller determines that the releasing of the mold has not been completed, the controller is configured to cease the imprint process.

17. The apparatus according to claim 14, wherein the controller is configured to cancel attraction of the substrate by the substrate holder, during the driving for the releasing of the mold, with respect to a region on the substrate for which the imprint process is being performed.

18. An imprint apparatus for performing an imprint process which includes molding of imprint material on a substrate with a mold and releasing of the mold from the molded imprint material, the apparatus comprising:
a substrate holder configured to hold the substrate;
a mold holder configured to hold the mold;
a driving device configured to perform driving, for the releasing of the mold, of at least one of the substrate holder and the mold holder;
a detector configured to detect whether a light has passed between the substrate holder and the mold holder; and a controller configured to determine whether the substrate sticks to the mold via the molded imprint material based on a detection result obtained by the detector.

19. An imprint apparatus for performing an imprint process which includes molding of imprint material on a substrate with a mold and releasing of the mold from the molded imprint material, the apparatus comprising:
a substrate holder configured to hold the substrate;
a mold holder configured to hold the mold;
a driving device configured to perform driving, for the releasing of the mold, of at least one of the substrate holder and the mold holder;
a detector configured to detect a position of a surface of the substrate in a direction perpendicular to a holding surface of the substrate holder, the detected position of the surface of the substrate being a portion of the surface of the substrate that is disposed outside a region of the substrate in which the imprint process is being performed; and
a controller configured to determine whether the substrate sticks to the mold via the molded imprint material based on the position of the surface of the substrate detected by the detector.

20. An imprint apparatus for performing an imprint process which includes molding of imprint material on a substrate with a mold and releasing of the mold from the molded imprint material, the apparatus comprising:
a substrate holder configured to hold the substrate;
a mold holder configured to hold the mold;
a driving device configured to perform driving, for the releasing of the mold, of at least one of the substrate holder and the mold holder;
a detector configured to obtain image data by taking an image of a surface of the substrate that is disposed outside a region of the substrate in which the imprint process is being performed; and
a controller configured to determine whether the substrate sticks to the mold via the molded imprint material based on the image data obtained by the detector.

21. An imprint apparatus for performing an imprint process which includes molding of imprint material on a substrate with a mold and releasing of the mold from the molded imprint material, the apparatus comprising:
a substrate holder configured to hold the substrate;
a mold holder configured to hold the mold;
a driving device configured to perform driving, for the releasing of the mold, of at least one of the substrate holder and the mold holder;
a vacuum line configured to cause the substrate holder to hold the substrate;
a detector configured to detect a gas pressure in the vacuum line; and
a controller configured to determine whether the substrate sticks to the mold via the molded imprint material based on the gas pressure in the vacuum line detected by the detector.

* * * * *